(12) United States Patent
Kim et al.

(10) Patent No.: US 6,720,217 B2
(45) Date of Patent: Apr. 13, 2004

(54) METHOD OF MANUFACTURING FLASH MEMORY DEVICE USING TRENCH DEVICE ISOLATION PROCESS

(75) Inventors: Jum Soo Kim, Ichon-Shi (KR); Sung Mun Jung, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/329,696

(22) Filed: Dec. 27, 2002

(65) Prior Publication Data

US 2004/0014281 A1 Jan. 22, 2004

(30) Foreign Application Priority Data

Jul. 18, 2002 (KR) ........................................ 2002-42163

(51) Int. Cl.$^7$ ............................................. H01L 21/336
(52) U.S. Cl. ....................... 438/257; 438/258; 438/266; 438/279; 438/424; 438/427
(58) Field of Search ................................ 438/200, 201, 438/257, 258, 259, 263, 264, 266, 279, 424, 427

(56) References Cited

U.S. PATENT DOCUMENTS 6,624,022 B1 * 9/2003 Hurley et al. ............... 438/256

* cited by examiner

*Primary Examiner*—Jack Chen
(74) *Attorney, Agent, or Firm*—Morgan, Lewis & Bockius LLP

(57) ABSTRACT

The present invention relates to a method of manufacturing a flash memory device. The method comprises the steps of sequentially depositing a pad oxide film and a pad nitride film on a semiconductor substrate, when trenches are formed by etching the pad nitride film, the pad oxide film and the substrate using a mask for forming a device isolation film, forming trenches having a different depth in a cell region and in a peripheral by controlling an etch angle and etch target depending on the width of the trench, depositing trench insulating films on the entire surfaces to bury the trenches with the trench insulating films, performing a chemical mechanical polishing process and a strip process for the trench insulating films to form the trench insulating film upper structures of which are protruded, forming a well region through an ion implantation process, and forming a tunnel oxide film, a floating gate, a dielectric film and a control gate. Therefore, as a cell source resistance is reduced, a back-bias effect generating due to the source resistance can be prevented. As the cell current is increased, the read speed of the device can be increased.

11 Claims, 6 Drawing Sheets

METHOD OF MANUFACTURING FLASH MEMORY DEVICE USING TRENCH DEVICE ISOLATION PROCESS

BACKGROUND OF THE INVENTION

1. Field of the Invention

The invention relates generally to a method of manufacturing a flash memory device capable of solving a problem of a cell source resistance and a problem of isolating a field oxide film in a peripheral region. More particularly, the invention relates to a method of manufacturing a flash memory device by which the depth of the trenches in the cell region and the peripheral region is differently formed upon a trench device isolation process.

2. Description of the Prior Art

Recently, in the flash memory device, a rapid read speed is required as the voltage of the peripherals is reduced and the cell speed of the memory cell is increased. In particular, a voltage drop effect is generated due to an operation of a page/burst mode in which several data are sent at a time upon a read operation. This voltage drop greatly affects the speed of the cell.

The flash memory device is usually formed by sequentially performing gate etch, self-aligned (SA) etch, self-aligned source (SAS) etch, and ion implantation for forming source and drain (S/D implantation. Arsenic (As) is used as a material ,for source and drain implantation. FIG. 1 is a cross sectional view of the flash memory device after ion implantation for source and drain is performed using As. From FIG. 1, it can be seen that a portion 104 into which ions are implanted is formed on a semiconductor substrate 102.

A method in which the source of the cell is commonly used in the flash memories and a single contact every 16 or 32 of the flash memory cell is used to connect them, is employed. Also, upon the read operation in the operation of the flash memory device, the source is grounded and the drain is applied with a voltage of about 0.8V. If the source resistance is increased, the voltage lower than the reference voltage is actually applied to the drain due to a back-bias effect. This causes to reduce the cell current. As a result, there occurs a problem that the read speed of the flash memory device is delayed. This problem in the read speed adversely affects the characteristics of the product, which greatly affects a competition in the market.

Recently, in manufacturing the flash memory device, a shallow trench isolation (STI) process has been used. As seen from FIG. 2, if As is implanted at a given angle, it has been known that As is actually implanted with a reduced amount of about ⅓ through ⅕ compared to the actually implanted dose or energy. In other words, if As is implanted with an given angle at the dose of $3E15$ atoms/cm$^2$ and energy of 30 KeV, as indicated by a reference numeral 30, this is same to a case where As is implanted at the dose of $7.8E14$ atoms/cm$^2$ and energy of about 7.8 KeV, as indicated by a reference numeral 32. Therefore, the source resistance is increased compared to a predicted resistance, which results in degrading the characteristics of the product.

In order to solve these problems, a method of reducing the entire length of the resistor, i.e., a method of reducing the depth of the trench has been used in the prior art. If this method is used, however, though a partial effect on the cell may be generated, there is a problem in device isolation of the field oxide film in the peripheral region. In particular, in case of the flash memory device, as the cells are driven by a high voltage, the isolation problem of the field oxide film in the peripheral region becomes further severe. As a result, this problem adversely affects the operating characteristic of the flash memory device. Therefore, though the trench profile was used in order to reduce the cell source resistance, the trench profile is changed in a process of forming a sacrificial oxide film after the trench device isolation process.

SUMMARY OF THE INVENTION

The present invention is contrived to solve the above problems and an object of the present invention is to provide a method of manufacturing a flash memory device by which the depth of trenches in a cell region and a peripheral region can be differently formed by controlling an etch angle and time depending on the width of a field oxide film upon a trench device isolation process of the flash memory device.

In order to accomplish the above object, a method of manufacturing a flash memory device according to the present invention, is characterized in that it comprises the steps of sequentially depositing a pad oxide film and a pad nitride film on a semiconductor substrate, when trenches are formed by etching the pad nitride film, the pad oxide film and the substrate using a mask for forming a device isolation film, forming trenches having a different depth in a cell region and in a peripheral by controlling an etch angle and etch target depending on the width of the trench, wherein the trench in a peripheral region is formed to be deeper than the trench in a cell region, depositing trench insulating films on the entire surfaces to bury the trenches with the trench insulating films, performing a chemical mechanical polishing process and a strip process for the trench insulating films to form the trench insulating film upper structures of which are protruded, forming a well region through an ion implantation process, and forming a tunnel oxide film, a floating gate, a dielectric film and a control gate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
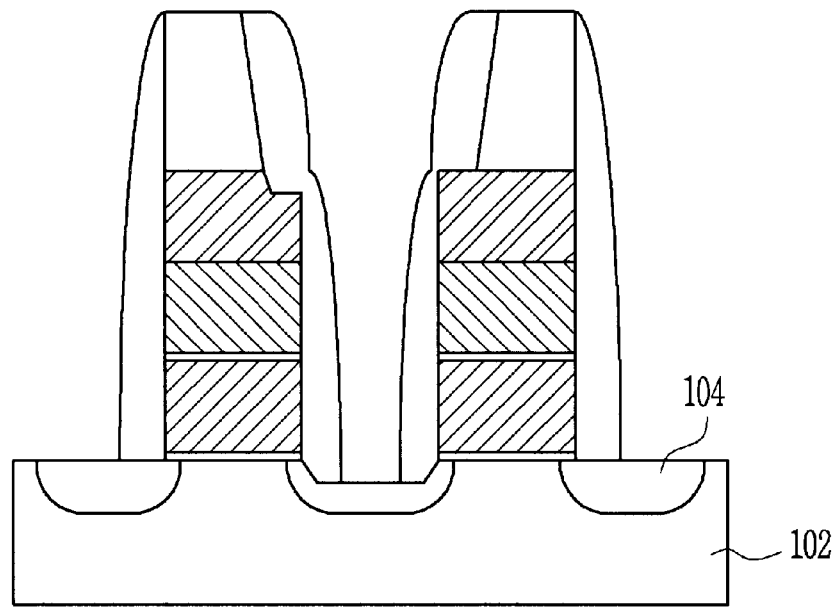
FIG. 1 is a cross sectional view of a conventional flash memory device after ion implantation for source and drain is performed using arsenic (As)
Figure 2:
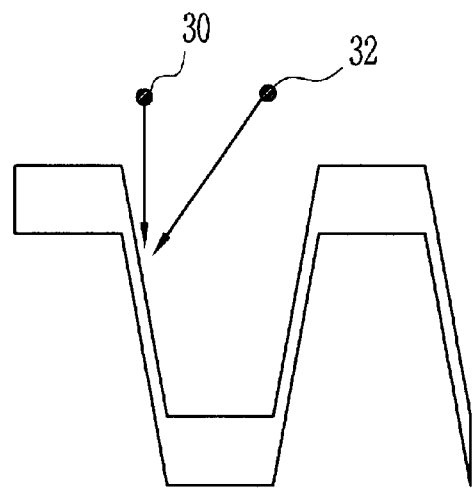
FIG. 2 is a drawing for explaining the difference in the implantation amount depending on the angle implanted when As is implanted.

The present invention will be described in detail by way of a preferred embodiment with reference to accompanying drawings, in which like reference numerals are used to identify the same or similar parts.

Figure 3A:
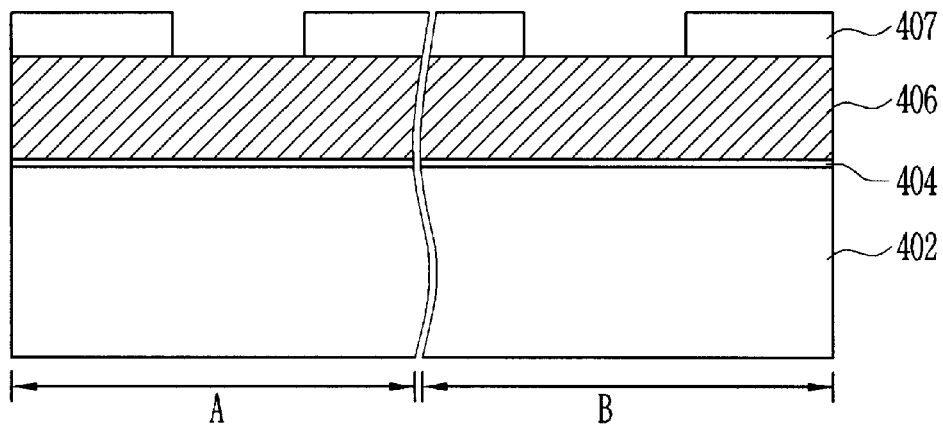
FIG. 3A through FIG. 3G are cross sectional views of flash memories for explaining a method of forming the flash memory device according to a preferred embodiment of the present invention.
Figure 3B:
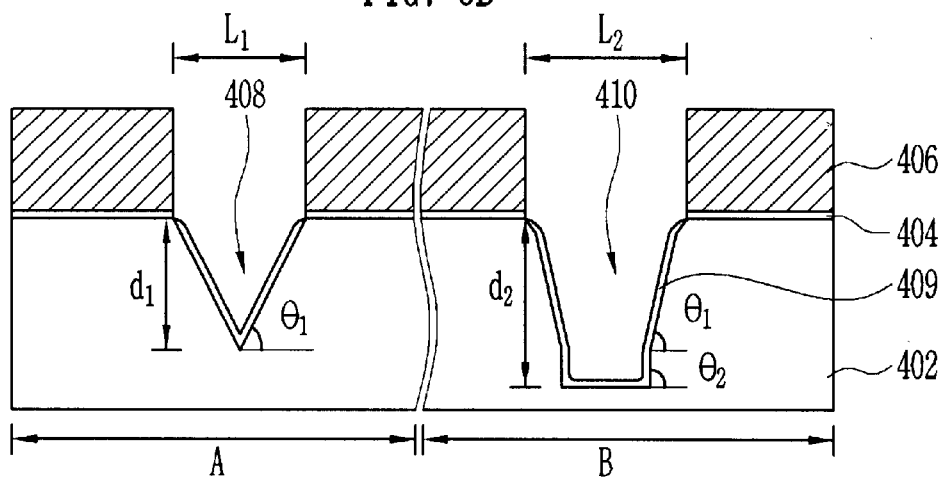
Figure 3C:
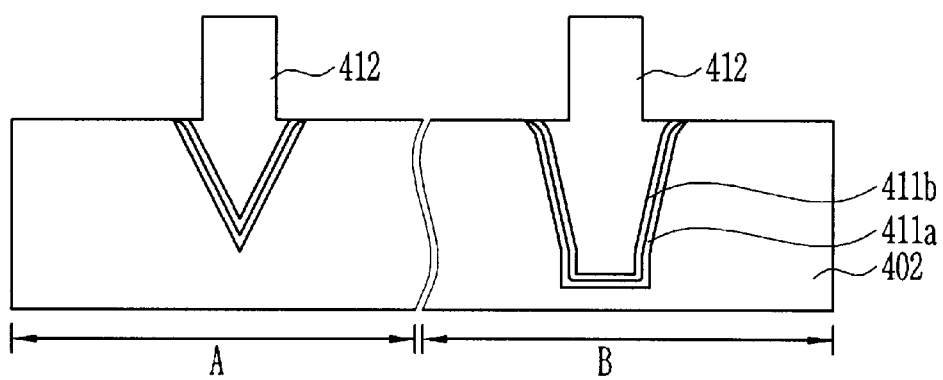

FIG. 3A through FIG. 3G are cross sectional views of flash memories for explaining a method of forming the flash memory device according to a preferred embodiment of the present invention. Here, FIG. 3A through FIG. 3C are cross sectional views of the flash memory devices showing both the cell region and peripheral region and FIG. 3D through FIG. 3G are cross sectional views of the flash memory devices showing the cell region only. In FIG. 3A through FIG. 3C, 'A' indicates the cell region and 'B' indicates the peripheral region.

Referring now to FIG. 3a, a pad oxide film 404 is formed on a semiconductor substrate 402 in order to prevent crystal defects on the surface of the semiconductor substrate 402 or process the surface of the substrate 402. The pad oxide film 404 is formed by means of dry or wet oxidization method. At this time, it is preferred that the pad oxide film 404 is formed in thickness of about 100Å through 300Å at a temperature of 700° C. through 1000° C. Next, a pad nitride film 406 is deposited on the pad oxide film 404. The pad nitride film 406 is formed by means of LP-CVD (low-pressure chemical vapor deposition) method. At this time, it is preferred that the pad nitride film 406 is formed to have a thickness in which a protrusion of a trench insulating film 412 to be formed in a subsequent process can be sufficiently protruded, for example, in thickness of about 2000 through 4000Å. By reference to FIG. 3b, after the pad nitride film 406 is formed, trenches 408 and 410 are formed in the semiconductor substrate 402 through patterning for forming a device isolation film, thus defining a device isolation region and an active region. In more detail, a photoresist pattern 407 defining the device isolation region is formed. Next,. the pad nitride film 406, the pad oxide film 404 and the semiconductor substrate 402 are etched using the photoresist pattern 407 as an etch mask, thus forming the trenches 408 and 410. At this time, the depths d1 and d2 of the trenches in the cell region A and the peripheral region B are differently formed by adjusting the etch angle θ1 and etch target. The trench formed in the cell region A indicates the reference numeral 408 and the trench formed in the peripheral region B indicates the reference numeral 410. In other words, in order to reduce the resistance, the depth d1 of the trench in the cell region A is formed to be shallow and the depth d2 of the trench in the peripheral region B is formed to be deep, as shown in FIG. 3B. At this time, the trench 408 in the cell region A has a shape the width of which is gradually reduced toward the bottom. The trench 410 of the peripheral region B is formed to have the same etch angle θ1 as the trench 408 of the cell region A up to the depth same to the trench 408 formed in the cell region A. However, the trench 410 of the peripheral region B is formed to have the etch angle θ2 higher than the trench 408 of the cell region A at the depth below the trench 408 formed in the cell region A. A method of varying the depth d1 of the trench in the cell region A by adjusting the etch angle θ1 will be described by reference to Table 1.

TABLE 1

| Angle (°) | Depth (Å) | | |
| --- | --- | --- | --- |
| | Width-2400Å | Width-2200Å | Width-2000Å |
| 70 | 3297 | 3022 | 2747 |
| 69 | 3126 | 2866 | 2605 |
| 68 | 2970 | 2723 | 2475 |
| 67 | 2827 | 2591 | 2356 |
| 66 | 2695 | 2471 | 2246 |
| 65 | 2573 | 2359 | 2145 |
| 64 | 2460 | 2255 | 2050 |
| 63 | 2355 | 2159 | 1963 |

TABLE 1-continued

| Angle (°) | Depth (Å) | | |
| --- | --- | --- | --- |
| | Width-2400Å | Width-2200Å | Width-2000Å |
| 62 | 2257 | 2069 | 1881 |
| 61 | 2165 | 1984 | 1804 |
| 60 | 2078 | 1905 | 1732 |
| 59 | 1997 | 1831 | 1664 |
| 58 | 1920 | 1760 | 1600 |
| 57 | 1848 | 1694 | 1540 |
| 56 | 1779 | 1631 | 1483 |
| 55 | 1714 | 1571 | 1428 |
| 50 | 1430 | 1311 | 1192 |
| 49 | 1380 | 1265 | 1150 |
| 48 | 1333 | 1222 | 1111 |
| 47 | 1287 | 1180 | 1072 |
| 46 | 1243 | 1139 | 1036 |

Referring to Table 1, the depth d1 etched is varied depending on the etch angle θ1. This is also varied depending on the width of the field oxide film formed in the trench region. In other words, the depth d1 of the trench formed in the cell region A can be controlled by adjusting the etch angle θ1 depending on the width L1 of the trench, upon the etch process. At this time, as the width L1 and L2 of the field oxide film is longer in the peripheral region B than in the cell region A, the depth d2 of the trench formed in the peripheral region B is further deep even though the etch angle θ1 is same. As a result, the etch process is performed using the etch depth d2 of the peripheral region B as an etch target upon the etch process. At this time, it is preferred that the etch angle θ1 is 50° C. through 70°. Also, it is preferable that the width L1 and L2 of the field oxide film formed in the trench region, i.e., the width of the trench is 0.1 through 0.6 μm.

Thereafter, in order to compensate for etch damage of the trench sidewall, a sacrificial oxide film 409 is formed on the inner wall of the trenches in the cell region and the peripheral region. The sacrificial oxide film 409 is formed by dry or wet oxidization method. At this time, it is preferred that the sacrificial oxide film is formed in thickness of about 200Å through 400Å at a temperature of about 700° C. through 1000° C. Next, after the sacrificial oxide film is removed using an etch solution, sidewall oxidizatin for removing damages depending on the trench etch is performed to form a sidewall oxide film 411a within the trenches. At this time, it is preferred that the sidewall oxide film 411a is formed in thickness of about 300Å through 600Å at a temperature of about 800° C. through 1000° C. by means of the wet oxidization method, and an overlapped region of the sidewall oxide film with the field oxide film is 40% through 70%.

A liner 411b is formed on the entire structure. The liner 411b serves to enhance an adhesive force with a trench insulating film to be formed in a subsequent process, prevent a moat that is formed by depression between the trench insulating film and the semiconductor substrate, and prevent a leakage to current. At this time, it is preferred that the liner 411b is formed using a high temperature oxide (HTO) film by means of a fineness process. For example, it is preferred that the liner 411b is formed in thickness of about 50Å through 300Å by reaction of $SiH_2C_{12}$ (dichlorosilane; DCS) and oxygen. At this time, the liner 411b may be formed by further performing a fineness process of 20 through 30 minutes as an annealing process using $N_2$ at a temperature of 900° C. through 1100° C. Also, the liner 411b may be formed using the nitride film instead of the oxide film.

Thereafter, the trenches 408 and 410 are buried with the trench insuating film. At this time, the trench inslating film is deposited in thickness by which it is sufficiently deposited over the surface of the pad nitride film 406 while sufficiently burying the trench, for example in thickness of about 4000Å through 8000Å. Also, it is preferable that the trench insulating film is formed using a HDP (high density plasma) oxide film. The trench insulating film is buried so that void, etc. is not formed within the trenches 408 and 410. In the above, the liner formation process, the deposition process of the trench insulating film and the annealing process may be performed in this order, instead of the order of the liner formation process, the annealing process and the deposition process of the trench insulating film.

After the trench is buried, a CMP (chemical mechanical polishing) process using the pad nitride film 406 as an etch stopper is performed for the entire surface to polish the trench insulating film. A cleaning process is then performed. The cleaning process is for removing residues of the trench insulating film that may remain on the pad nitride film after the CMP process. At this time, the cleaning process is performed so that the pad nitride film 406 is not over etched. Further, it is preferred that reduction in the height of the trench insulating film is prohibited by maximum.

Next, the pad nitride film 406 is removed by a strip process using $H_3PO_4$ (phosphoric acid) solution, thus forming the trench insulating films 412, i.e., field oxide films upper structures of which are protruded, as shown in FIG. 3c. At this time, it is preferred that the protrusions of the trench insulating films 412 have a thickness of 100Å through 1000Å from the surface of the semiconductor substrate 402. An explanation will be below made centering on the cell region.

A cleaning process using HF or BOE (buffer oxide etchant) is performed for the entire surface to etch the protrusions of the trench insulating films 412 by a given width.

At this time, an overlapped region of the protrusions with the field oxide film is formed to be 30% through 40% by controlling the time of the cleaning process. The free degree of this cleaning process is greatly affected by formation of a dual profile when the trench is formed. Upon a subsequent tunnel oxide film process, the free degree is closely related to a phenomenon that the tunnel oxide film is made thin and affects formation of the transistor.

Figure 3D:
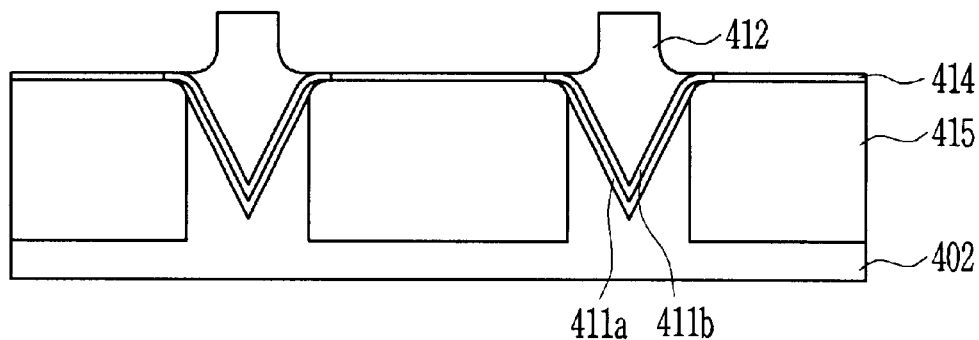

Referring now to FIG. 3D, a screen oxidation process is performed on the active region for a implantation process for forming wells and a implantation process for controlling threshold voltage, thus forming a screen oxide film 414 of 30Å through 100Å in thickness. Next, a well region (not shown) is formed at the active region of the semiconductor substrate 402 by performing the ion implantation process for forming wells and an impurity region (not shown) is formed by performing the ion implantation process for controlling threshold voltage.

Thereafter, after the screen oxide film 414 is removed by the cleaning process, a tunnel oxide film 416 is formed on the portions from which the screen oxide film 414 is removed. At this time, the tunnel oxide film 416 is formed by performing a wet oxidization process at a temperature of 750 through 800Å to deposit the tunnel oxide film and then performing an annealing process using $N_2$ at a temperature of 900 through 910° C. for 20 through 30 minutes in order to minimize an interfacial defect density with the semiconductor substrate 402. Also, the thickness of the tunnel oxide film 416 may be formed to be thicker, by 1.05 through 1.4 times at its edge portion than at its central portion. In order to adjust the thickness, the cleaning process may be performed.

Figure 3E:
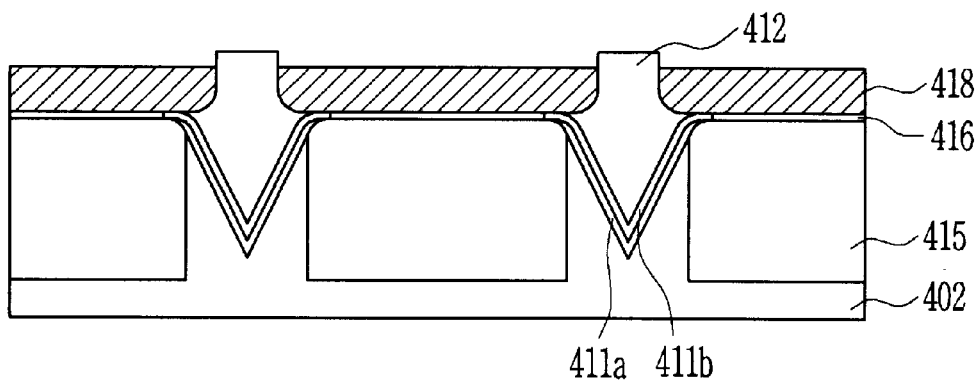

Referring now to FIG. 3e, a first polysilicon film 418 is deposited on the entire surface and is then experienced by a CMP process. At this time, it is preferred that the thickness of the first polysilicon film is deposited to be thicker by 200Å through 1000Å than the top surface of the trench insulating film 412. Also, it is preferred that the CMP process is performed so that the thickness of the first polysilicon film 418 can uniformly remain about 1000Å through 1700Å while the floating gate is completely separated by the trench insulating film 412.

Figure 3F:
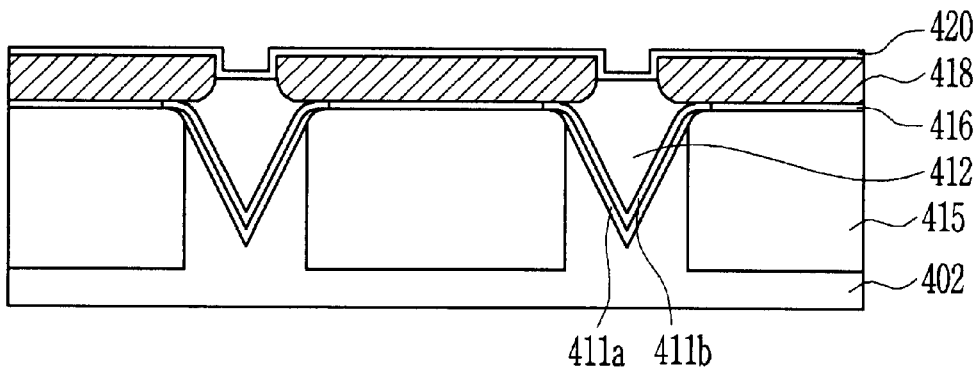
Figure 3G:
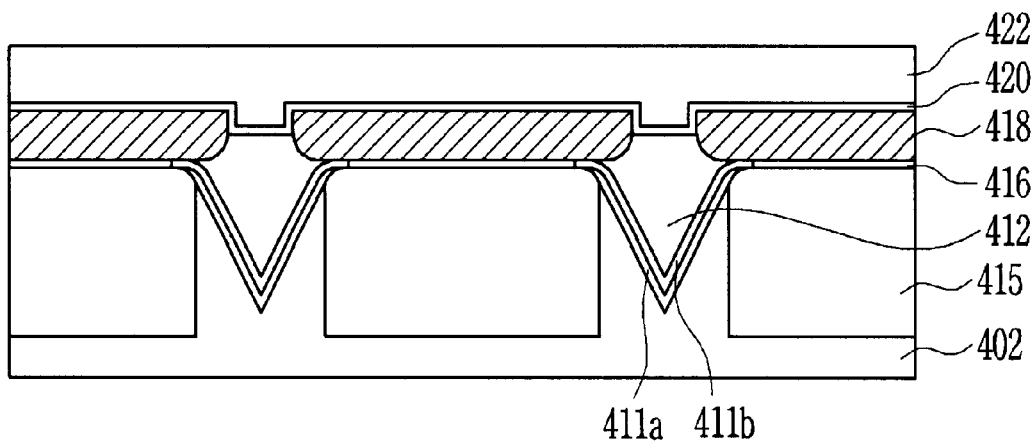

By reference to FIG. 3f, the trench insulating films protruded between the first polysilicon films 418 are etched by a cleaning process using HF or BOE. A dielectric film 420 is formed on the first polysilicon film 418 and the trench insulating film 412. At this time, it is preferred that the dielectric film 420 has a structure of an oxide film/nitride film/oxide film/nitride shape, that is, an ONON ($SiO_2/Si_3N_4/SiO_2/Si_3N_4$) structure or a structure of an oxide film/nitride film/oxide film shape, that is, an ONO ($SiO_2/Si_3N_4/SiO_2$) structure. Also, it is preferable that the thickness of the ONON structure and the ONO structure is 35Å through 80Å, respectively.

Next, a second polysilicon film 422 for forming a control gate and a silicide film are formed, and a gate patterning process is then performed. At this time, the second polysilicon film may be formed by a LP-CVD (low pressure-chemical vapor deposition) method, and may be formed in thickness of 500Å through 2000Å using doped polysilicon, or in thickness of 500Å through 2000Å using doped polysilicon and 50Å through 200Å using un-doped poly-silicon.

Subsequent processes to be performed are same to common processes in the flash memory device. Thus, a detailed explanation of them will be omitted.

Figure 4:
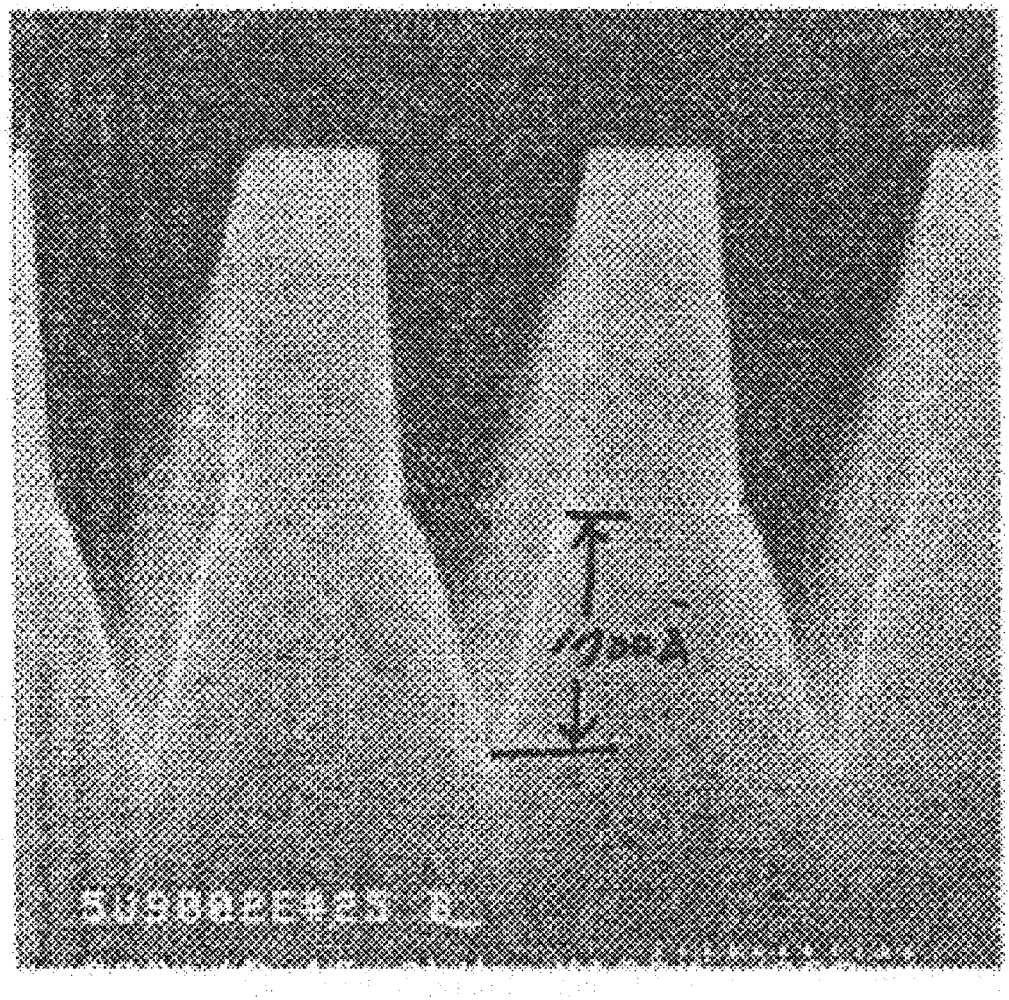
FIG. 4 is a photography showing a profile of a cell region when a trench is formed by the present invention.
Figure 5:
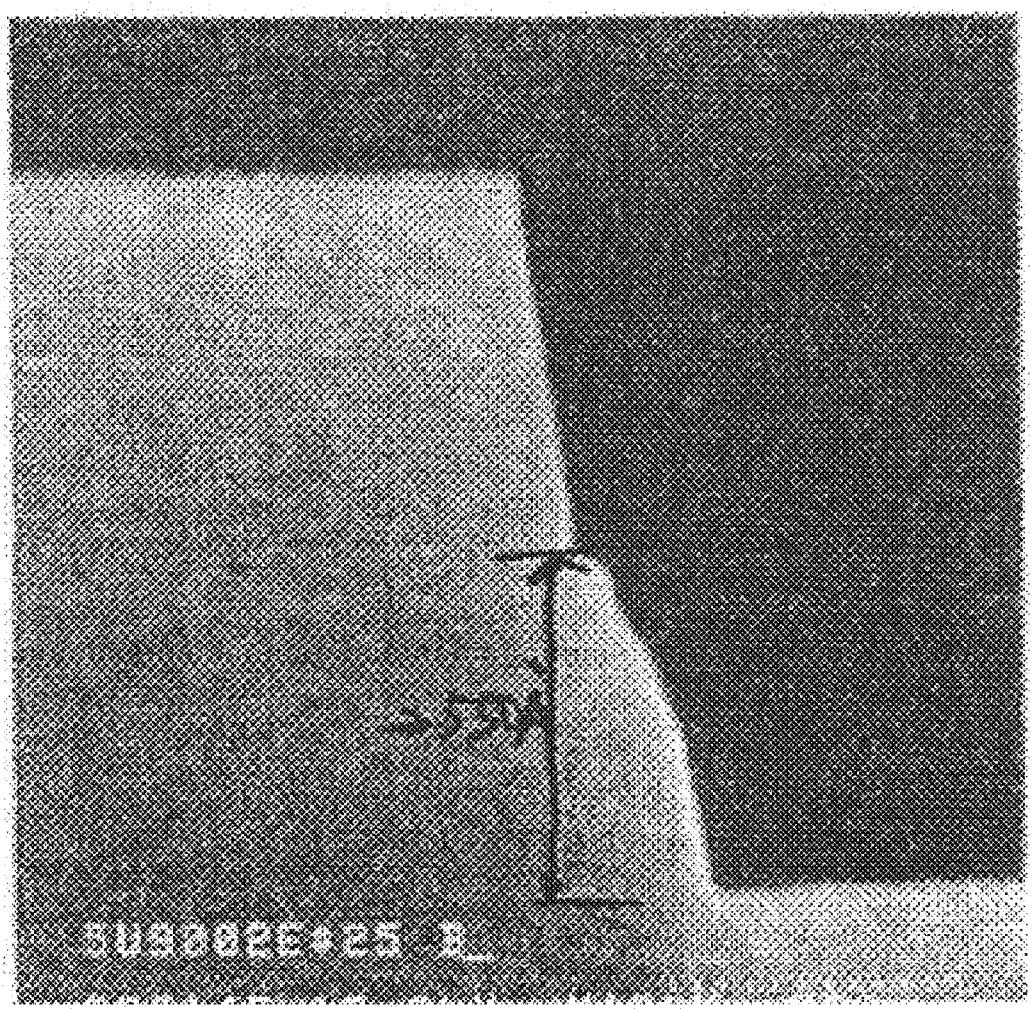
FIG. 5 is a photography showing a profile of a peripheral region when the trench is formed by the present invention.

FIG. 4 and FIG. 5 are photography illustrating the profiles of the cell region and the peripheral region when the trench is formed by the present invention, which show the profiles when the etch angle is 60° and etch target is 2500Å. As seen from FIG. 4, in case of the cell, the depth of the trench is about 1700Å. As seen from FIG. 5, in case of the peripheral region, the depth of the trench is about 2500Å. It can be seen that the depth of the peripheral region may be deep since the profile such as the cell is firstly maintained and the slant is then greatly etched from a portion where etching of the cell region is stopped.

As mentioned above, according to the present invention, upon a trench device isolation process of a flash memory device, the depth of trenches in a cell region and a peripheral region are differently formed by controlling an etch angle and time, thus reducing a cell source resistance. Therefore, the present invention has advantageous effects that it can reduce a back-bias effect due to the source resistance and can increase the cell current to increase the read speed. Further, the source resistance can be controlled through control of the etch angle without additional mask and process. The present invention has an outstanding advantage that it can secure various process margins.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device using trench isolation process, comprising the steps of:
   (a) sequentially depositing a pad oxide film and a pad nitride film on a semiconductor substrate;
   (b) forming trenches by etching the pad nitride film, the pad oxide film and the substrate using a mask for forming a device isolation film, wherein the trenches have a different depth in a cell region and in a peripheral region formed simultaneously by controlling an etch angle and etch target depending on the width of the trenches formed in the cell region and the peripheral region, and the trench in a peripheral region is formed to be deeper than the trench in a cell region;
   (c) depositing trench insulating films on the entire surfaces of the semiconductor substrate to bury the trenches with the trench insulating films;
   (d) performing a planarization process and a strip process for the trench insulating films to form the trench insulating films upper structures of which are protruded;
   (e) forming a well region through an ion implantation process in the semiconductor substrate; and
   (f) forming a tunnel oxide film, a floating gate, a dielectric film and a control gate on the predetermined area of the semiconductor substrate.

2. The method as claimed in claim 1, wherein the trench in the cell region has a shape of the width of which is gradually reduced toward the bottom, and the trench of the peripheral region is formed to have the same etch angle as the trench of the cell region up to the depth same to the trench formed in the cell region and have the etch angle higher than the trench of the cell region at the depth below the trench formed in the cell region.

3. The method as claimed in claim 1, wherein in the step (b), the etch angle is 50° through 70°.

4. The method as claimed in claim 1, wherein in the step (b), the width of the trench in the cell region is 0.1 through 0.6 μm.

5. The method as claimed in claim 1, wherein the pad oxide film is formed by dry or wet oxidization method and is formed in thickness of 100 Å through 300 Å at a temperature of 700° C. through 1000° C.

6. The method as claimed in claim 1, wherein the pad nitride film is formed by a low-pressure chemical vapor deposition (LP-CVD) method and is formed in thickness of 2000 Å through 4000Å.

7. The method as claimed in claim 1, further comprising the steps of: after the step (b),
   forming a sacrificial oxide film on an inner wall of the trenches in the cell region and the peripheral region;
   removing the sacrificial oxide film using an etch solution and then forming a sidewall oxide film on the inner wall of the trench; and
   forming a liner on the entire structure formed the sidewall oxide film.

8. The method as claimed in claim 7, wherein the sacrificial oxide film is formed by dry or wet oxidization method and is formed in thickness of 200 Å through 400 Å at a temperature of 700° C. through 1000° C.

9. The method as claimed in claim 7, wherein the sidewall oxide film is formed in thickness of 300 Å through 600 Å by means of a wet oxidization method at a temperature of 800° C. through 1000° C.

10. The method as claimed in claim 7, wherein the liner is formed using a high-temperature oxide (HTO) film and is formed in thickness of 50 Å through 300 Å by reacting DCS and oxygen.

11. The method as claimed in claim 1, wherein in the step (c), the trench insulating film is formed in thickness of 4000 Å through 8000 Å using a high density plasma (HDP) oxide film.

* * * * *